US012545041B2

(12) United States Patent
Montagutelli

(10) Patent No.: US 12,545,041 B2
(45) Date of Patent: Feb. 10, 2026

(54) THERMAL PRINTING SYSTEM

(71) Applicant: APS FRANCE, Beaucouzé (FR)

(72) Inventor: Denis Montagutelli, Angers (FR)

(73) Assignee: APS FRANCE, Beaucouzé (FR)

( * ) Notice: Subject to any disclaimer, the term of this patent is extended or adjusted under 35 U.S.C. 154(b) by 152 days.

(21) Appl. No.: 18/705,182

(22) PCT Filed: Aug. 10, 2022

(86) PCT No.: PCT/EP2022/072491
§ 371 (c)(1),
(2) Date: Apr. 26, 2024

(87) PCT Pub. No.: WO2023/072452
PCT Pub. Date: May 4, 2023

(65) Prior Publication Data

US 2024/0416667 A1 Dec. 19, 2024

(30) Foreign Application Priority Data

Oct. 27, 2021 (FR) ...................................... 2111416

(51) Int. Cl.
*B41J 2/35* (2006.01)
*B41J 29/02* (2006.01)
*G01R 33/07* (2006.01)

(52) U.S. Cl.
CPC ................ *B41J 29/02* (2013.01); *B41J 2/35* (2013.01); *G01R 33/072* (2013.01)

(58) Field of Classification Search
CPC ....... B41J 2/32; B41J 2/35; B41J 29/02; B41J 29/00; B41J 29/023; B41J 29/026; G01R 33/072
See application file for complete search history.

(56) References Cited

U.S. PATENT DOCUMENTS

| | | | | |
|---|---|---|---|---|
| 2006/0082636 A1* | 4/2006 | Maruyama | B41J 2/325 347/198 |
| 2011/0122214 A1* | 5/2011 | Kitamura | B41J 17/02 347/213 |
| 2017/0326894 A1* | 11/2017 | Ando | B41J 2/32 |
| 2019/0240991 A1 | 8/2019 | Komagome et al. | |

OTHER PUBLICATIONS

International Search Report dated Nov. 3, 2022 for corresponding International Application No. PCT/EP2022/072491, filed Aug. 10, 2022.
Written Opinion of the International Searching Authority dated Nov. 3, 2022 for corresponding International Application No. PCT/EP2022/072491, filed Aug. 10, 2022.
English translation of the Written Opinion of the International Searching Authority dated Nov. 3, 2022 for corresponding International Application No. PCT/EP2022/072491, filed Aug. 10, 2022.

* cited by examiner

*Primary Examiner* — Kristal Feggins
(74) *Attorney, Agent, or Firm* — David D. Brush; Westman, Champlin & Koehler, P.A.

(57) ABSTRACT

A thermal printing system, which includes: a fixed frame; a movable frame integrating a printing head, surmounting the fixed frame and pivotably mounted relative to the fixed frame; and an electrical connection connecting a controller to the printing head. The electrical connection is in the form of a flexible electrical connection ribbon having two essentially planar portions connected by a 180° fold.

11 Claims, 11 Drawing Sheets

[Fig. 1]
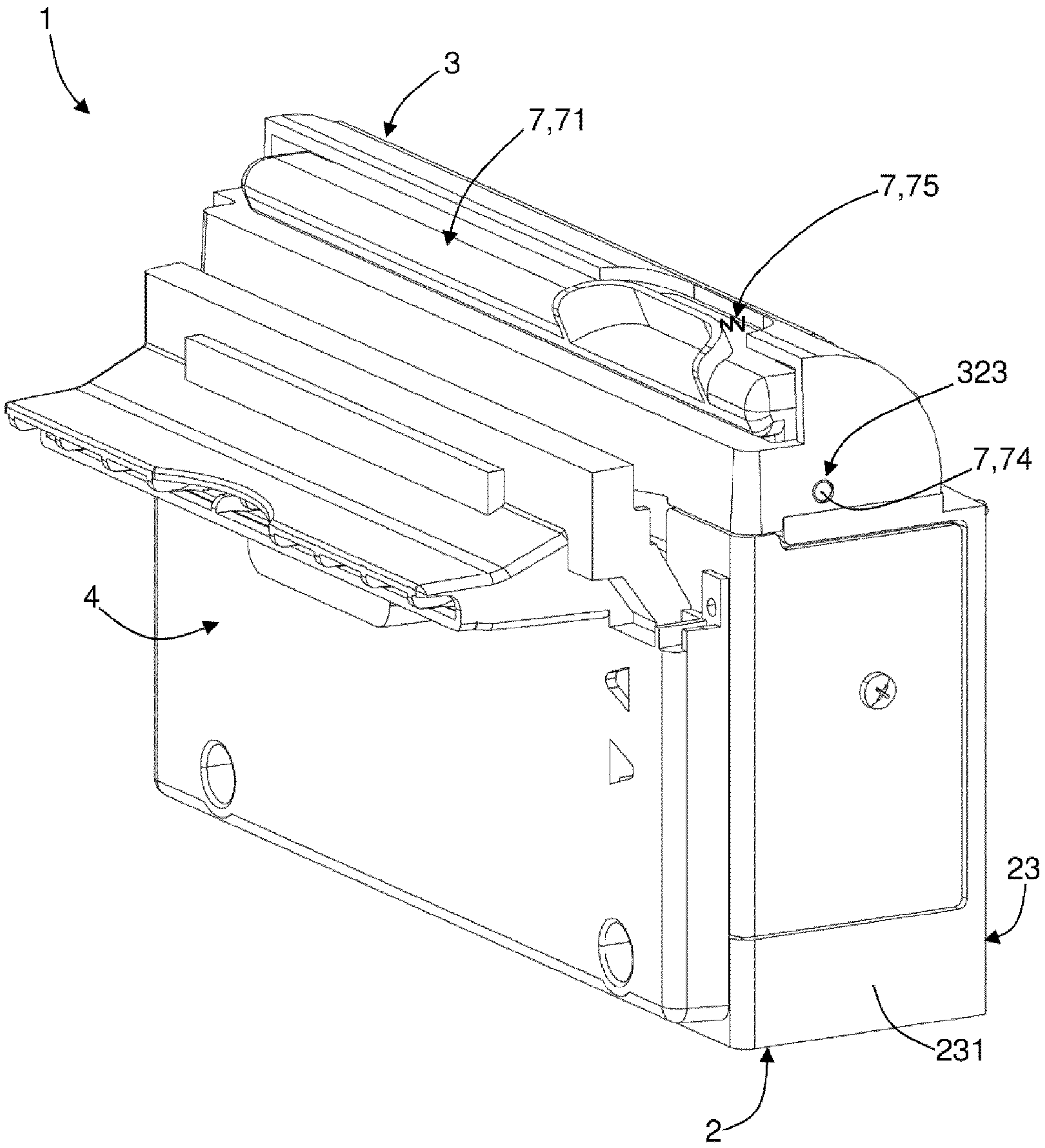

[Fig. 2]
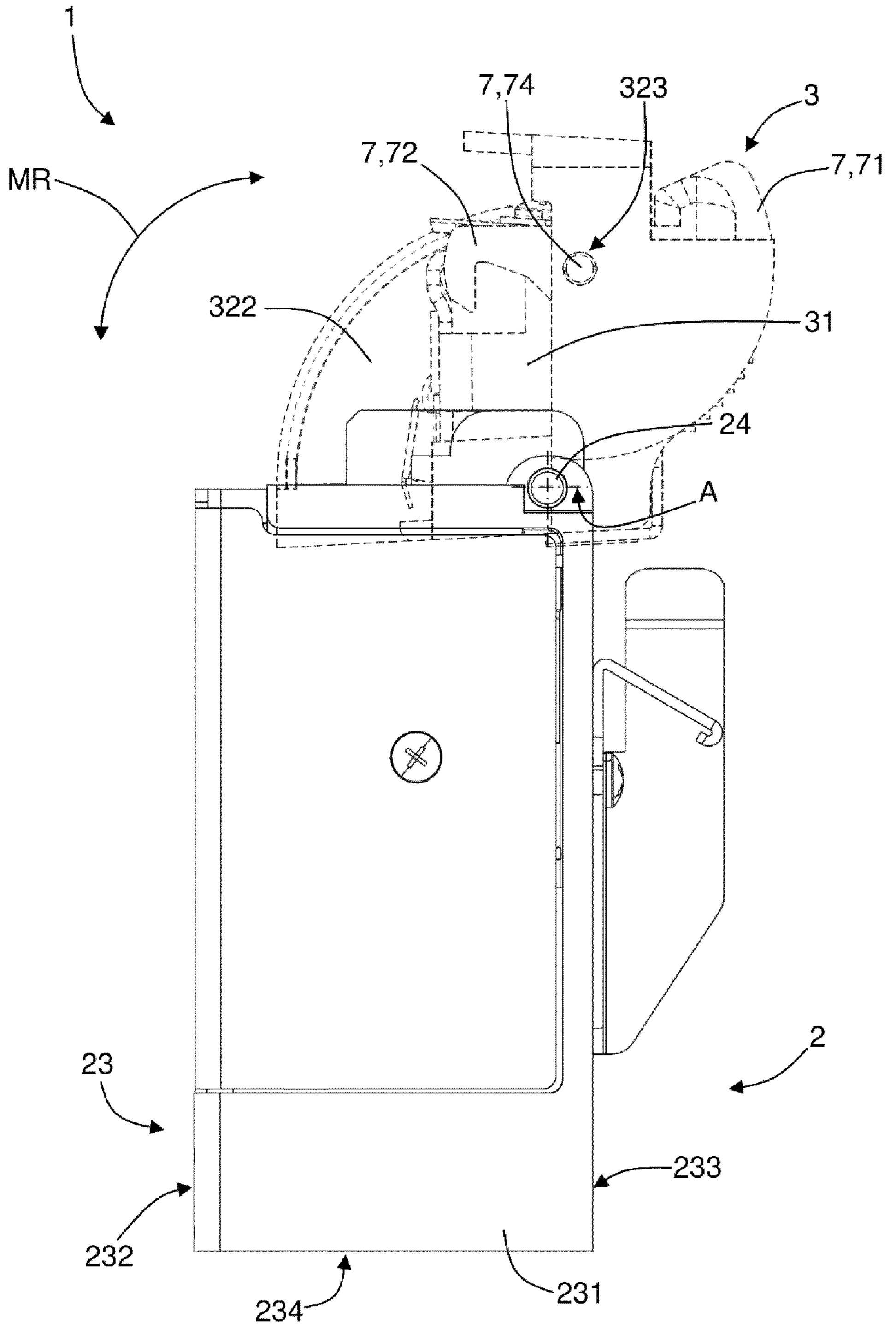

[Fig. 3]
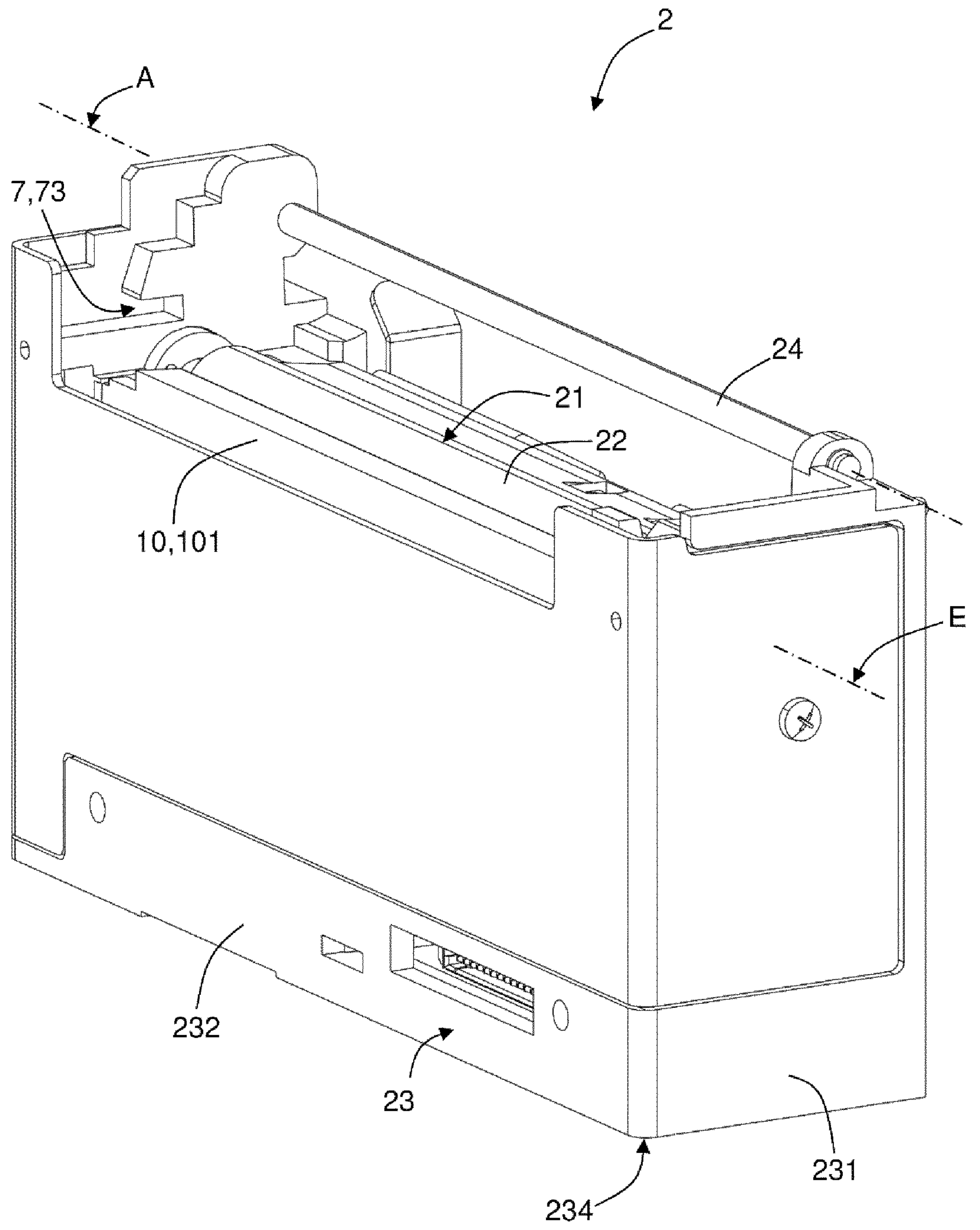

[Fig. 4]
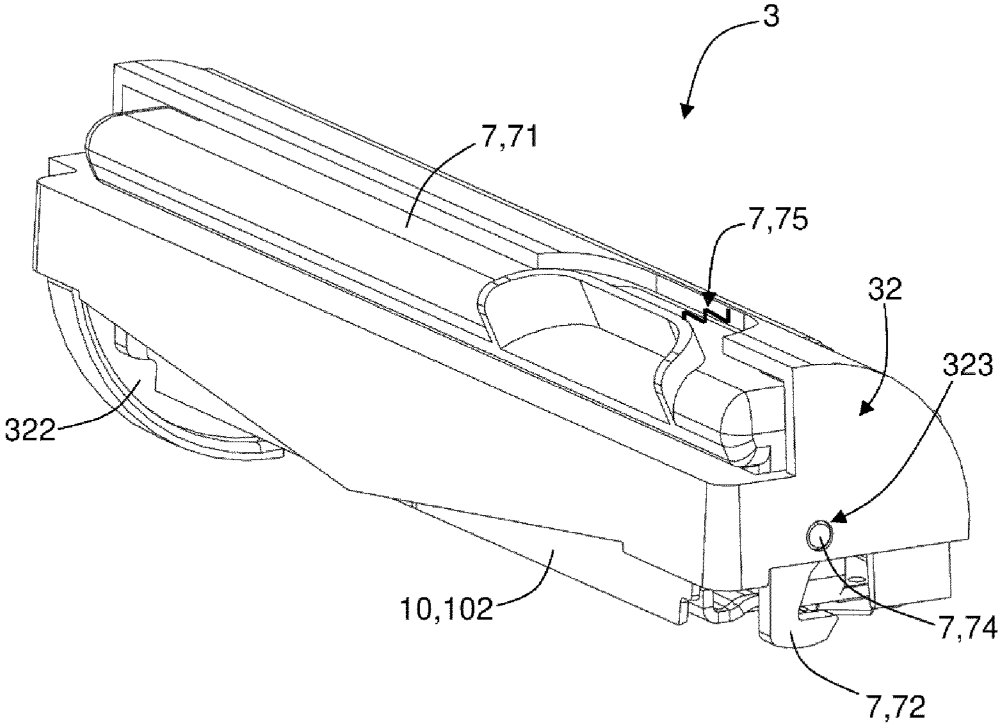

[Fig. 5]
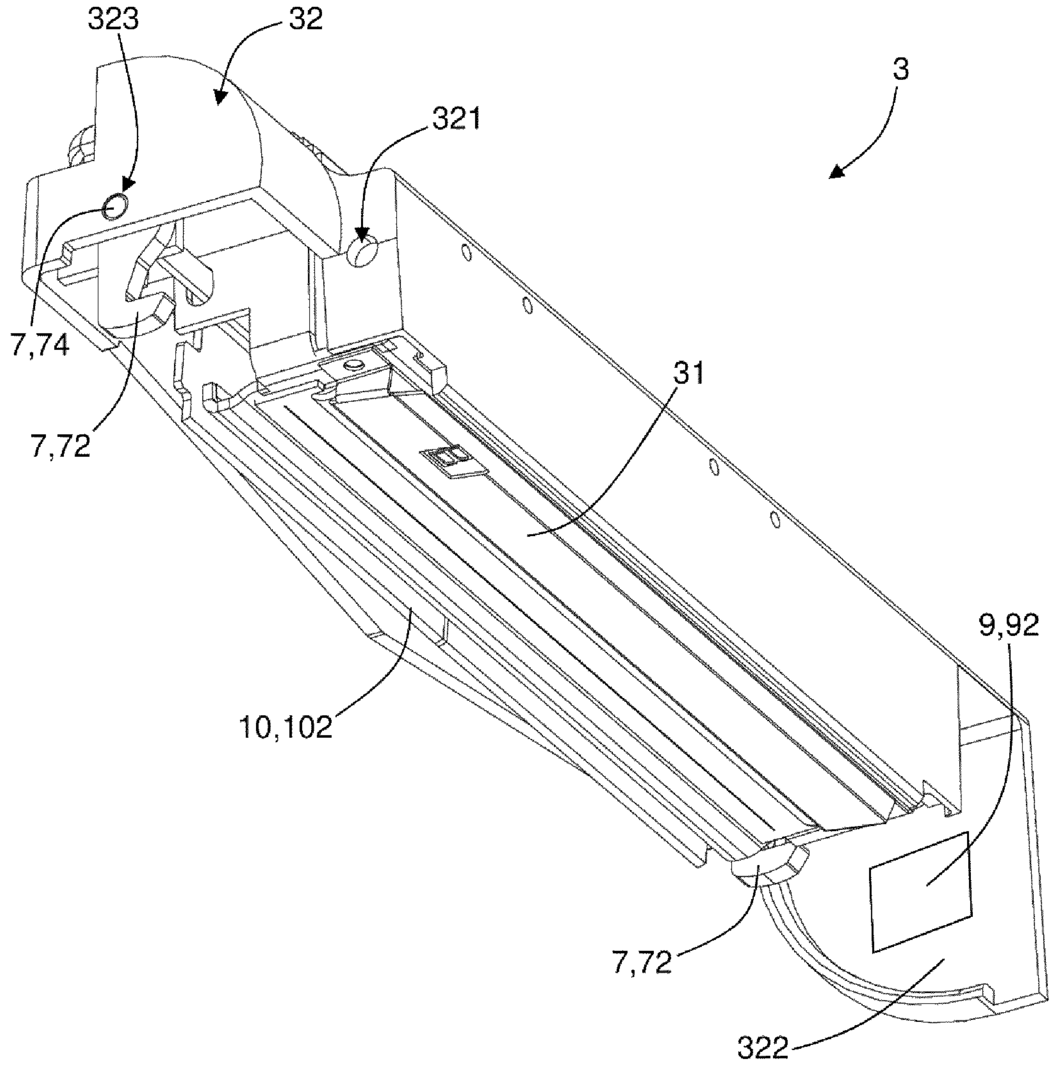

[Fig. 6]
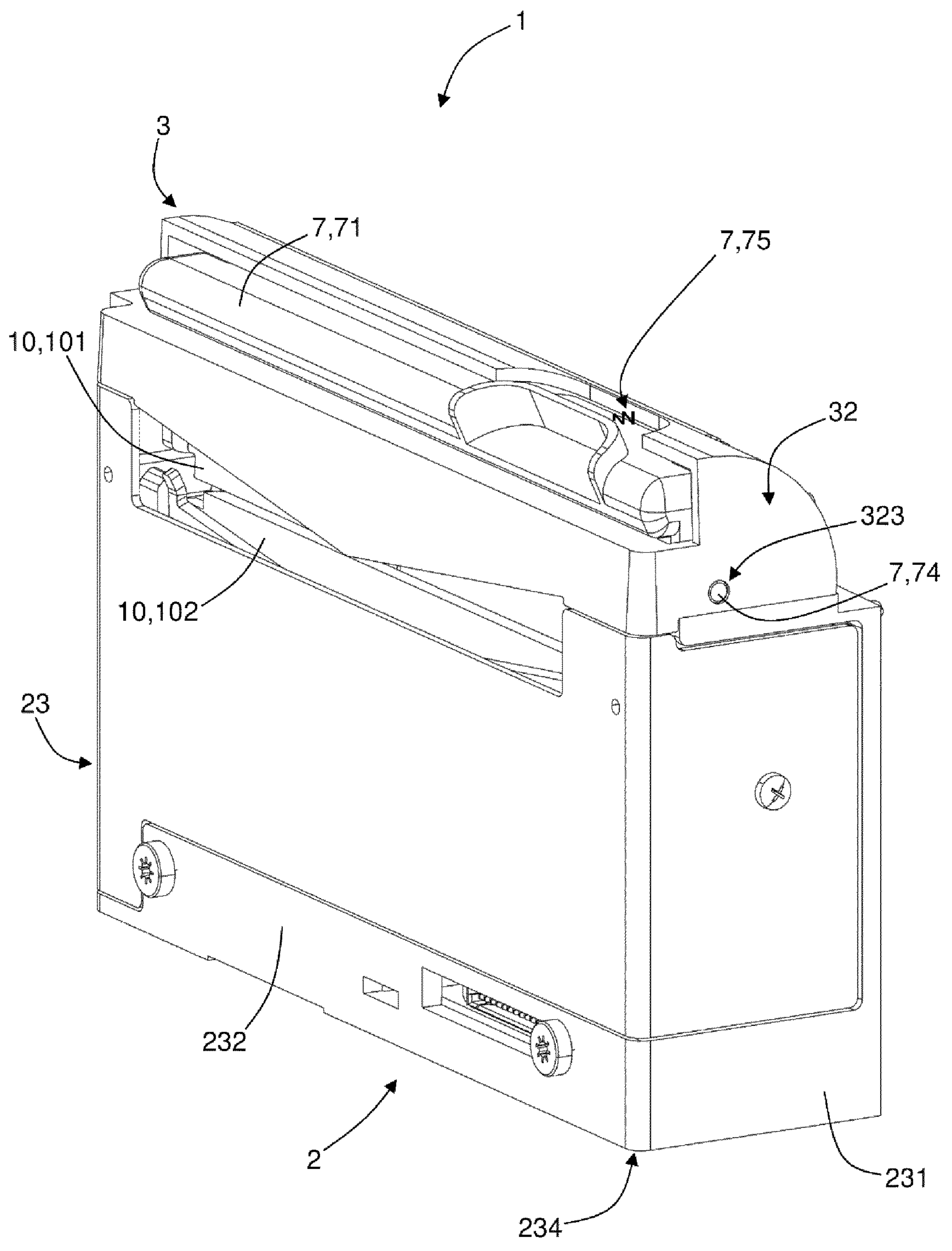

[Fig. 7]
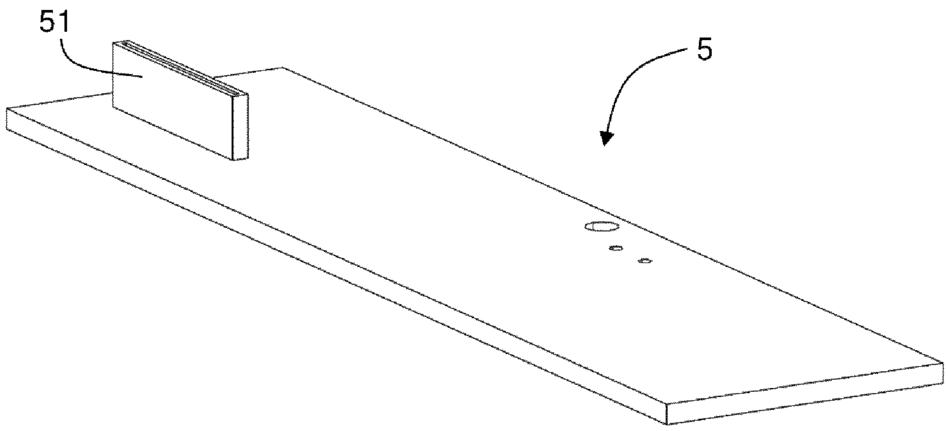

[Fig. 8]
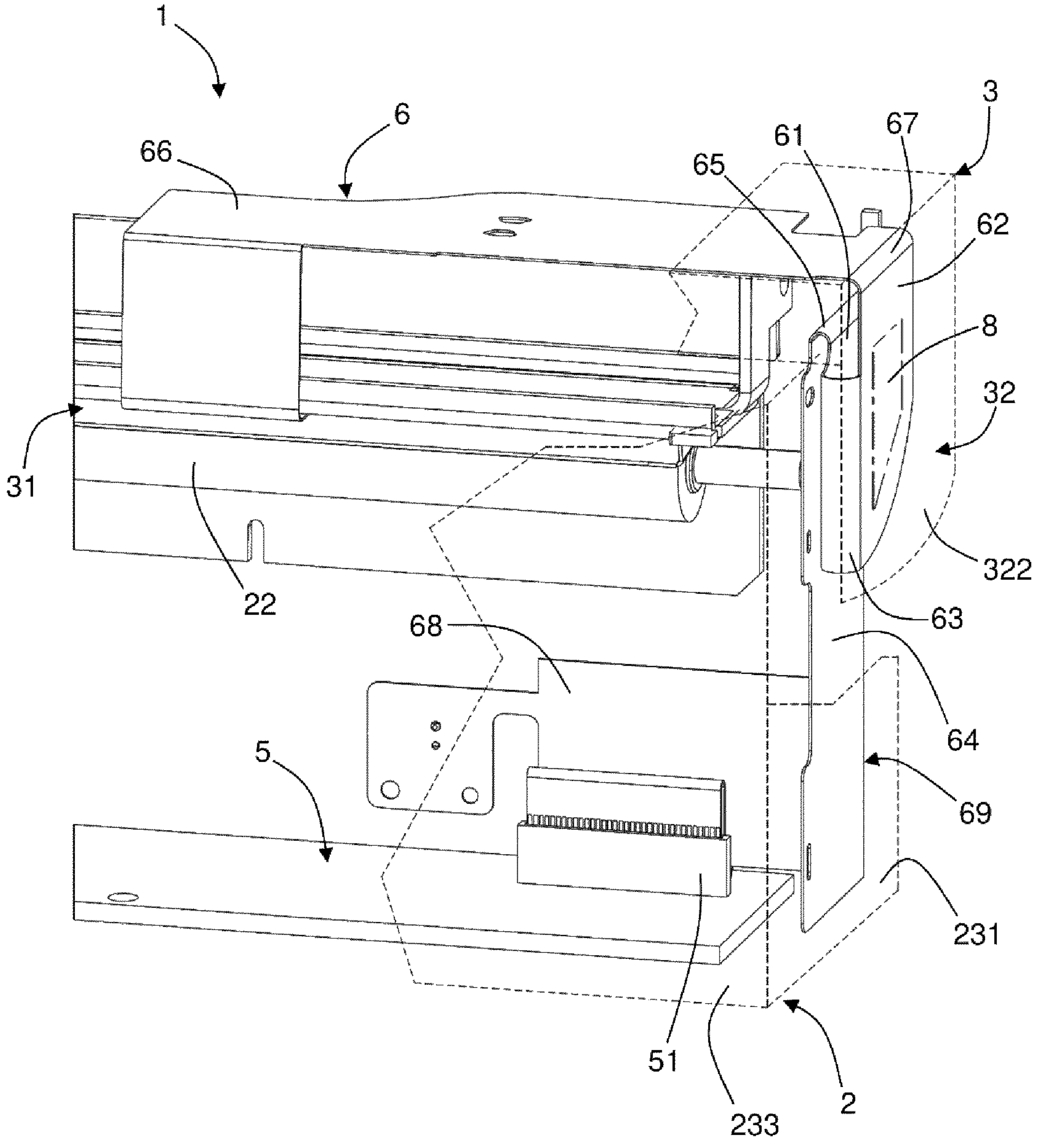

[Fig. 9]
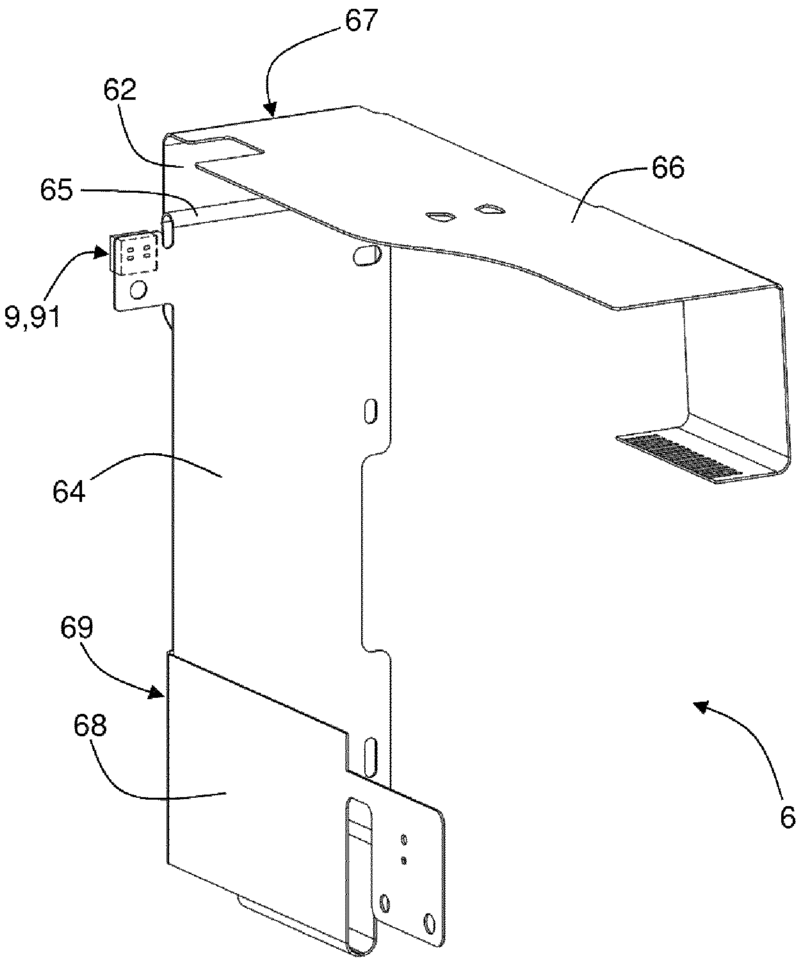

[Fig. 10]
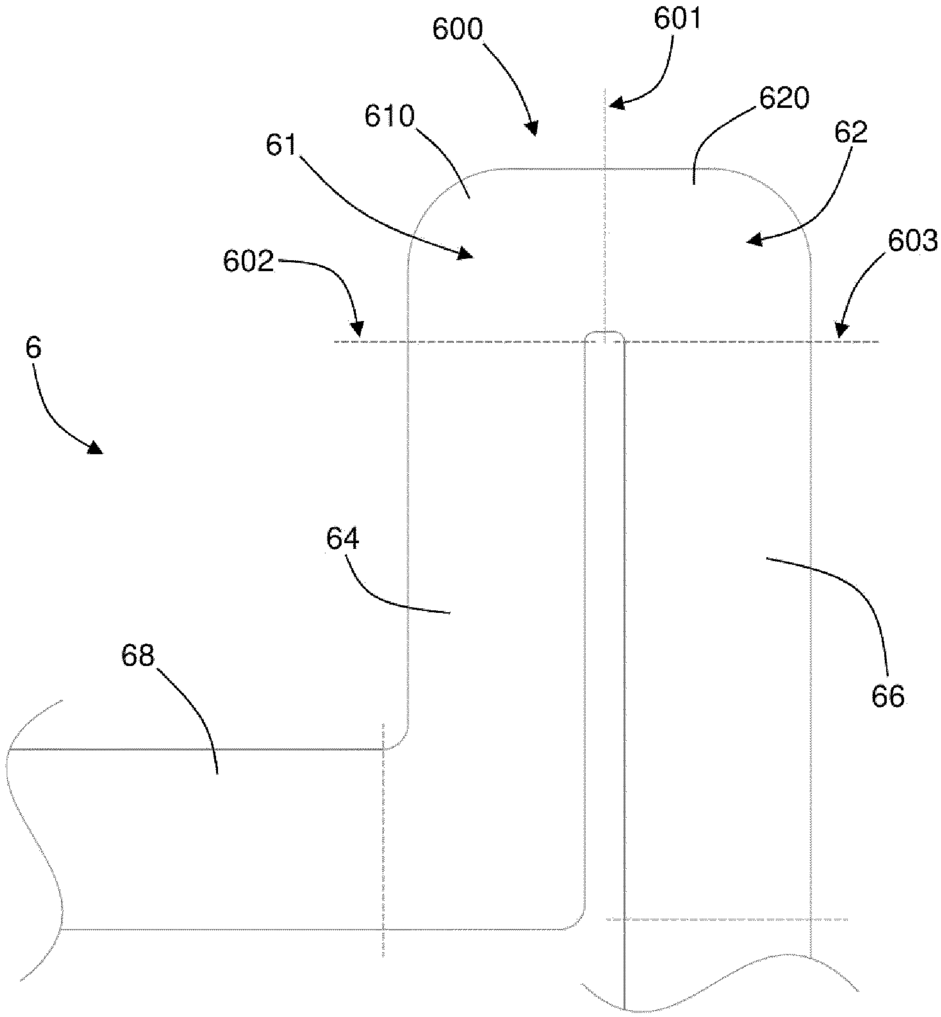

[Fig. 11]
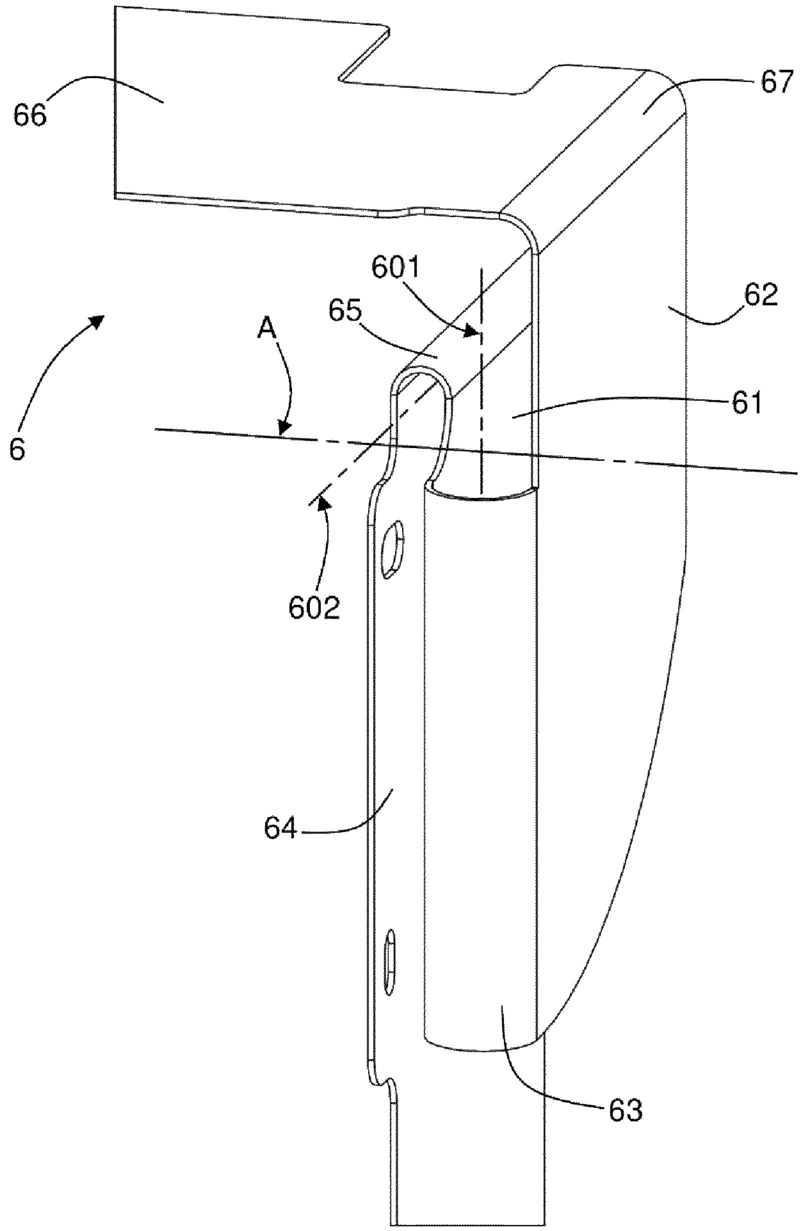

THERMAL PRINTING SYSTEM

CROSS-REFERENCE TO RELATED APPLICATIONS

This Application is a Section 371 National Stage Application of International Application No. PCT/EP2022/072491, filed Aug. 10, 2022, and published as WO 2023/072452 A1 on May 4, 2023, not in English, which claims priority to French Patent Application No. 2111416, filed Oct. 27, 2021, the contents of which are hereby incorporated by references in their entireties.

FIELD OF THE DISCLOSURE

The field of the invention is that of the design and manufacture of printing systems.

More specifically, the invention relates to a thermal printing system.

BACKGROUND OF THE DISCLOSURE

Thermal printing systems are known in particular for printing tickets on demand.

For example, thermal printing systems are found in standalone equipment such as parking ticket dispensers, train or flight ticket dispensers or systems for printing queue management receipt tickets.

Hence, these thermal printing systems are integrated into equipment and should be simple to maintain, compact and able to be manufactured at low cost.

Conventionally, thermal printing systems consist of two portions, namely a fixed frame and a movable frame overhanging the fixed frame, the movable frame being rotatably mounted relative to the fixed frame.

Thus, the movable frame could adopt a closed position in which it enables printing of a paper strip, and an open position in which it enables maintenance of the thermal printing system.

In some thermal printing systems, so-called printing systems from above, the printed face of the paper strip is directly visible to the user who retrieves the print. These systems for printing from above are used in particular for printing of cinema seats, parking tickets or transport tickets.

In these systems for printing from above, the fixed frame supports a printing roll movable in rotation about an axis of rotation. The roll allows driving the paper strip to be printed via a drive motor coupled to the printing roll.

In turn, the movable frame comprises a printing head integrating a support made of ceramic which carries a line of heating spots allowing printing characters or images on the paper strip.

The movable frame also comprises a spring mechanism intended to hold the pressure of the printing head, and therefore the line of heating spots, against the drive roll.

Conventionally, the paper strips to be printed feeding the thermal printing system are packaged in the form of rolls or strips of predetermined length folded in a zig-zag like fashion.

Moreover, these thermal printing systems often comprise cutting means positioned downstream of the movable frame and of the fixed frame according to the running direction of the paper strip to cut the paper strip after printing.

Thus, once printing of the paper strip is completed, the cutting means cut the paper thereby forming a ticket which is delivered to an end user.

Some thermal printing systems also comprise an electronic board for controlling the paper strip printing and cutting functions.

To carry out maintenance operations, in particular those consisting in eliminating a paper jam, it is necessary to be able to separate the movable frame from the fixed frame in order to clear a space located between the printing head and the drive roll, which allows cleaning a passage area of the paper strip.

In other words, to carry out maintenance of the thermal printing system, it is necessary to position the movable frame in its open position.

However, this separation should take into account an electrical connection interface between the movable frame and the fixed frame. Indeed, such a connection interface enables the continuous transit of information and/or electric currents between the fixed frame and the movable frame for controlling the printing head by the electronic board in particular.

Nonetheless, this electrical connection interface, which enables the passage of a large number of electrical signals, should of course be repositioned after each movement of the movable frame relative to the fixed frame. In other words, the electrical connection interface should be able to return to an identical position enabling the transit of the electric currents and of the information at each repositioning of the printing head bearing on the drive roll, that being so despite a large number of handling operations.

Indeed, a poor repositioning of the electrical connection interface creates a risk of malfunction of the thermal printing system. Conventionally, this electrical connection interface between the movable frame and the fixed frame is made by means of a plurality of electrical cables which should be taken into account upon movement and repositioning of the movable frame relative to the fixed frame to avoid breakage thereof and/or disconnection thereof from the printing head.

There are currently two types of thermal printing systems on the market.

A first type consists in mounting the frame movable in rotation on the fixed frame by a hinge extending according to an axis transverse to the axis of rotation of the printing roll, i.e. according to the running direction of the paper strip in the thermal printing system.

This configuration has the main advantage of being able to use a flexible electrical connection ribbon between the movable frame and the fixed frame, which allows making the thermal printing system more compact and low-cost. The flexible ribbon is then positioned on the side of the thermal printing system.

Nonetheless, this thermal printing system has a major drawback in that it requires a large space surrounding the movable frame for the pivoting handling of the movable frame.

Indeed, this type of system having a width larger than its depth, the rotation of the movable frame generates a free circular sweep that is quite large so that the movable frame does not encounter any obstacle during rotation thereof, the obstacles preventing the correct separation of the movable frame with respect to the fixed frame.

It is specified that the width and depth dimensions are defined with respect to the axis of rotation of the drive roll. Also, the width is measured parallel to the axis of rotation of the drive roll and the depth is measured transversely to the axis of rotation of the drive roll, i.e. according to the running direction of the paper strip in the thermal printing system.

This results in that, in order to enable optimum use of the printing system according to this first embodiment, the equipment in which the printing system is mounted should have a large unused space enabling handling and rotation of the movable frame relative to the fixed frame.

Yet, in equipment integrating this type of thermal printing systems, the compactness objective is a major criterion.

According to a second known type, the movable frame is rotatably mounted on the fixed frame according to an axis essentially parallel to the axis of rotation of the printing roll.

Since the thermal printing system has a width larger than its depth, the available volume necessary for pivoting of the movable frame relative to the fixed frame is reduced compared to the rotation system transverse to the axis of rotation of the printing roll.

However, the running of the paper strip to be printed being done in the depth direction, it is not possible to position the electrical connection means between the movable frame and the fixed frame at the hinge. In such a position, the electrical connection means would prevent the passage of the paper strip to be printed.

The electrical connection means, in this case a plurality of cables, are positioned on the side of the thermal printing system, which increases its width.

In addition, pivoting of the movable frame relative to the fixed frame requires a cable length that is large enough to enable pivoting of the movable frame without the risk of tearing off the electrical connection means.

In other words, the cables forming the electrical connection means should have enough length to enable the movement of the movable frame relative to the fixed frame, which could be at the origin of a discomfort upon folding of the movable frame on the fixed frame.

The patent document relating to the field of the invention published under the number US 2019/0240991 A1, which describes a printing system, is also known.

SUMMARY

An exemplary embodiment of the present disclosure relates to a thermal printing system, of the type comprising:

- a fixed frame integrating a drive roll movable in rotation about a drive axis and intended to drive running of a strip of paper;
- a movable frame surmounting the fixed frame and carrying a printing head opposite the drive roll, the movable frame being pivotably mounted relative to the fixed frame about an axis of rotation parallel to the drive axis between a closed position on the running surface and an open position in which it is separated away from the running surface,
- means for electrically connecting the printing head to control means, characterized in that the electrical connection means are in the form of a flexible electrical connection ribbon, and in that the flexible ribbon has, on the side of the fixed frame, in the closed position of the movable frame, two essentially planar portions extending in planes parallel to one another, including a first portion for connection to control means, secured to the fixed frame, and a second portion for connection to the printing head, secured to the movable frame, the first portion and the second portion being connected by a 180° fold movable in a plane orthogonal to the axis of rotation between the open position and the closed position of the movable frame or vice versa.

Such a thermal printing system allows combining the advantages of the thermal printing systems the pivoting of the movable frame of which is done according to an axis of rotation parallel to the drive axis with the advantages of the thermal printing systems the pivoting of the movable frame of which is done according to an axis of rotation transverse to the drive axis, without the drawbacks thereof.

More particularly, pivoting of the movable frame according to an axis of rotation parallel to the drive axis allows limiting the volume that should be left free around the thermal printing system to enable opening thereof or closure thereof, i.e. the passage of the movable frame from its closed position into its open position, or vice versa.

Moreover, the use of a flexible electrical connection ribbon allows holding the electrical connection between the fixed frame and the movable frame without any risk of pinching and sectioning of the connection cables.

This advantage is enhanced by the fact that the ribbon has, on the side of the fixed frame according to the axis of rotation, two essentially planar portions connected to each other by a 180° fold movable in a plane orthogonal to the axis of rotation.

Thus, each portion moves relative to the other upon passage of the movable frame from its closed position into its open position, and vice versa, the 180° fold could be unwound to limit twisting of the ribbon and therefore tearing off thereof.

Furthermore, the 180° fold allows controlling the proper unwinding and the proper winding of the flexible ribbon during the change of position of the movable frame with respect to the fixed frame.

According to an advantageous aspect, the flexible ribbon comprises, when positioned flat between a third portion and a fourth portion, a U-like shape having a base, a first wing intended to form the first portion, and a second wing intended to form the second portion, the base having:

- a 180° first fold line of the flexible ribbon at the junction between the first wing and the second wing;
- a 180° second fold line of the flexible ribbon at the junction between the first wing and the third portion, and
- a 90° third fold line of the flexible ribbon located between the second wing and the fourth portion.

Thus, the flexible ribbon may be manufactured flat before being shaped according to the different fold lines.

This then facilitates the manufacture of the thermal printing system as well as assembly thereof.

On the other hand, the flat packaging of the flexible ribbon enables the integration of electronic components before shaping the flexible ribbon and then integrating it into the thermal printing system. This avoids the need for a multitude of cables between the components each carried by an electronic circuit and a common control board.

According to another advantageous aspect, the thermal printing system also comprises a device for detecting the position of the movable frame with respect to the fixed frame, this detection device being connected to the electronic control board of the thermal printing system to ensure safeguarding of the thermal printing system when the movable frame is in its open position.

Thus, when the movable frame is in its open position, heating (necessary for printing) of the printing head could be stopped.

According to another advantageous aspect, the detection device comprises:

- a Hall-effect sensor secured to one amongst the fixed frame and the movable frame, and
- a permanent magnet secured to the other one amongst the movable frame and the fixed frame, the sensor and the magnet facing one another in the closed position of the movable frame.

The use of a Hall effect sensor enables a fine and accurate detection of the position of the movable frame with respect to the fixed frame.

Henceforth, if the position between the movable frame and the fixed frame is no longer compliant with the printing conditions, then the detection device will detect this non-compliance.

According to another advantageous aspect, the thermal printing system comprises a mechanism for locking the movable frame in the closed position.

The locking mechanism allows avoiding an inadvertent opening of the printing system.

In other words, the locking mechanism allows ensuring holding of the thermal printing system in operating condition.

According to another advantageous aspect, the locking mechanism comprises:

- a handling member secured to the movable frame;
- at least one hook secured to the handling member, and
- at least one member for holding the hook secured to the fixed frame.

Such a design of the locking mechanism is simple and enables an easy integration into the thermal printing system.

Furthermore, such a design makes the mechanism simple to maintain.

According to another advantageous aspect, the second portion of the flexible ribbon is fastened to the movable frame via a double-sided type adhesive tape.

The use of such an adhesive tape allows facilitating the assembly of the printing system.

Indeed, thanks to the double-sided adhesive tape, it is possible to secure the tape only to the flexible ribbon or to the movable frame and to carry out an accurate pre-positioning of the flexible ribbon before final securing thereof to the movable frame or to the flexible ribbon.

Thus, the risks of poor positioning of the flexible ribbon on the movable frame are limited, a poor positioning could generate a pinching or a sectioning of the flexible ribbon between the movable frame and the fixed frame.

According to another advantageous aspect, the thermal printing system comprises a device for cutting a printed paper strip, the cutting device comprising a first cutting member secured to the fixed frame, and a second cutting member secured to the movable frame, opposite the first cutting member.

Thus, the cutting device allows cutting out the paper strip after printing to form tickets at the appropriate size.

Thus, this cutting device facilitates withdrawal of the ticket by a user who then does not have to cut the paper strip manually with the risk of tearing off the printed ticket.

According to another advantageous aspect, the flexible ribbon comprises a fifth portion extending the third portion and forming a 90° outer fold with the third portion.

The fifth portion allows keeping a constant electrical connection with an electronic board without any risk of tearing off since it is remote from the 180° fold which enables the deformation of the flexible ribbon upon rotation of the movable frame.

According to another advantageous aspect, the thermal printing system comprises an electronic control board of the thermal printing system fixedly mounted with respect to the fixed frame.

This electronic board allows controlling the printing head.

According to another advantageous aspect:

- the second fold line is intended to form an axis of the radius of curvature of an inner fold between the first portion and the third portion,
- the first fold line is intended to form an axis of the radius of curvature of the 180° fold, and in that, in the closed position of the movable frame, the first line, the second fold line and the axis of rotation are perpendicular in pairs in a three-dimensional space.

The mutual perpendicularity of the first line, the second fold line and the axis of rotation allows ensuring a good mobility of the movable frame relative to the fixed frame at least in a rotation comprised between 0° and 90°, these angle values corresponding respectively to the closed position and to the open position of the movable frame.

BRIEF DESCRIPTION OF THE DRAWINGS

Other features and advantages of the invention will appear more clearly upon reading the following description of an embodiment of the invention, given as an illustrative and non-limiting example, and from the appended drawings, wherein:

FIG. 1 is a top perspective view of a thermal printing system according to the invention;

FIG. 2 is a side view of a portion of the thermal printing system according to the invention;

FIG. 3 is a top perspective view of a fixed frame of the thermal printing system according to the invention;

FIG. 4 is a top perspective view of a movable frame of the thermal printing system according to the invention;

FIG. 5 is a bottom perspective view of a movable frame of the thermal printing system according to the invention;

FIG. 6 is a top perspective view of a portion of the thermal printing system according to the invention;

FIG. 7 is a top perspective view of an electronic board of the thermal printing system according to the invention;

FIG. 8 is a back top perspective view of a flexible ribbon enabling electrical connection between a printing head and the electronic board of the thermal printing system according to the invention;

FIG. 9 is a front top perspective view of the flexible ribbon of the thermal printing system according to the invention;

FIG. 10 is a schematic illustration of the flat pattern of a portion of the flexible ribbon of FIG. 8, FIG. 11 is a simplified detail of FIG. 8 illustrating the positioning of plies of the flexible ribbon with respect to an axis of rotation of the movable frame relative to the fixed frame.

DETAILED DESCRIPTION OF ILLUSTRATIVE EMBODIMENTS

FIGS. 1 to 10 illustrate a thermal printing system 1 according to the invention.

The thermal printing system 1 comprises:

- a fixed frame 2 (FIG. 3);
- a movable frame 3 (FIGS. 4 and 5) surmounting the fixed frame 2;
- an outlet mouth 4 (FIG. 1);
- an electronic board 5 (FIG. 7);
- electrical connection means (FIGS. 8 to 10).

The electrical connection means allow connecting the electronic board 5 to the different components secured to the fixed frame 2 and to the movable frame 3.

The electrical connection means are in the form of a flexible ribbon 6 as explained hereinafter.

Referring to FIG. 3, the fixed frame 2 has a running surface 21 of a paper strip to be printed.

The fixed frame 2 integrates a drive roll 22 of said paper strip to be printed. The running surface 21 is then formed by the generatrix of the drive roll 22 with which the paper strip to be printed is in line contact.

The drive roll 22 is mounted movable in rotation about a drive axis E and is intended to drive running of the paper strip to be printed.

As illustrated in FIG. 3, the fixed frame 2 has a framework 23 comprising two lateral walls 231 connected to each other by a front wall 232 and a rear wall 233. In other words, the lateral walls 231 extend between the front wall 232 and the rear wall 233.

The electronic board 5, illustrated in FIG. 7, is accommodated in the fixed frame 2.

The electronic board 5 is located in the vicinity of a bottom 234 of the fixed frame 2.

This positioning of the electronic board 5 allows facilitating the connection with means for controlling a support in which the thermal printing system 1 is integrated.

The movable frame 3 is pivotably mounted relative to the fixed frame 2 about an axis of rotation A parallel to the drive axis E.

For this purpose, the fixed frame 2 also integrates a rod 24 extending between the two lateral walls 231 and forming means for pivoting the movable frame 3 on the fixed frame 2.

The rod 24 is parallel to the drive axis E, as illustrated in FIG. 3.

Referring to FIG. 2, the movable frame 3 is pivotably mounted relative to the fixed frame 2, according to a rotational movement MR, between a closed position and an open position.

In this case, in FIG. 2, the movable frame 3 is illustrated in its open position.

In its closed position, as illustrated in FIGS. 1 and 6, the movable frame 3 is closed on the running surface 21 of the fixed frame 2.

On the other hand, in its open position, the movable frame 3 is separated away from the running surface 21 and leaves free access to the latter, as illustrated in FIG. 2. In FIG. 2, the movable frame 3 is illustrated in dotted lines.

The rod 24 forms the axis of rotation A of the movable frame 3 relative to the fixed frame 2.

Referring to FIGS. 4 and 5, the movable frame 3 is now described.

The movable frame 3 carries a printing head 31 intended to be positioned opposite the running surface 21 in the closed position of the movable frame 3. The printing head 31 carries a line of heating spots opposite the running surface to thermally print the paper strip that runs between the printing head 31 and the drive roll 22.

In the open position of the movable frame 3, the printing head 31 is separated away from the running surface 21.

The movable frame 3 comprises a shell 32 provided with two orifices 321 opposite to one another. These orifices 321 are intended to receive the rod 24 of the fixed frame 2 to enable pivoting of the movable frame 3 relative to the fixed frame 2.

The shell 32 has a cheek 322 which extends transversely to the axis of rotation A when the movable frame 3 is mounted on the fixed frame 2.

As explained hereinafter, this cheek 322 allows positioning and protecting the flexible ribbon 6 during handling of the movable frame 3 to position it in its closed position or in its open position.

Preferably, the printing head 31 is elastically mounted in the shell 32 of the movable frame 3. More specifically, the printing head 31 is elastically mounted on the movable frame 3 by means of a spacer device which tends to separate the printing head 31 away in the direction of the fixed frame 2. This spacer device integrates springs which are compressed by the printing head 31 when the movable frame 3 is in its closed position, and then tend to push the printing head 31 back against the drive roll 22.

Referring to FIG. 1, the outlet mouth is intended to be arranged opposite the front wall 232 of the frame 23 of the fixed frame 2.

The outlet mouth 4 enables a user to be able to retrieve a printed paper generally dispensed in the form of a ticket. The outlet mouth 4 may also have light-emitting diodes enabling a user to be informed on a printing in progress and/or the end of printing.

To enable printing of data on a paper strip, the thermal printing system 1 is connected to computer or communication means via the electronic board 5.

Referring to FIG. 7, the electronic board 5 carries a component 51 for connection with electrical connection means allowing interconnecting the flexible ribbon 6 to the electronic board 5 and controlling the entirety of the thermal printing system 1.

As described before, the electrical connection means are in the form of a flexible ribbon 6, as illustrated in FIGS. 8, 9 and 10.

The flexible electrical connection ribbon 6 is first formed flat as schematically illustrated in FIG. 10. The flexible ribbon 6 is then shaped so as to be inserted inside the fixed frame 2 on the one hand and the movable frame 3 on the other hand.

As illustrated in FIG. 8, the flexible ribbon 6 is formed, and the fixed frame 2 is schematically illustrated.

The flexible ribbon 6 has, on the side of the fixed frame 2, perpendicular to the axis of rotation A, two planar or at least essentially planar portions 61, 62 extending in planes parallel to one another.

More particularly, the flexible ribbon 6 has a first portion 61 extending towards the electronic board 5 and a second portion 62 extending towards the printing head 31.

The first portion 61 and the second portion 62 are connected by a 180° fold 63. The 180° fold 63 is movable in a plane orthogonal to the axis of rotation A between the open position and the closed position of the movable frame 3, or vice versa.

The 180° fold 63 allows, upon pivoting of the movable frame 3 relative to the fixed frame 2, deforming the flexible ribbon 6 to accompany the movement of the movable frame 3 relative to the fixed frame 2 and thus ensuring electrical continuity between the movable frame 3 and the fixed frame 2 independently of their relative position.

Furthermore, this allows avoiding an electrical disconnection and a systematic electrical reconnection of the movable frame 3 to the electronic board upon each opening or closure of the thermal printing system 1, i.e. upon each passage of the movable frame 3 from its closed position into its open position, or vice versa.

The second portion 62 of the flexible ribbon 6 is fastened to the movable frame 3 via a double-sided adhesive tape 8. By double-sided type, it should be understood that the adhesive tape 8 has two adhesive faces opposite to one another.

The adhesive tape 8 is glued by a first one amongst these faces to the second portion 62 of the flexible ribbon 6 before its second sticky face is glued against the cheek 322 of the shell 32 of the movable frame 3.

The first portion 61 of the flexible ribbon 6 may also be partially fastened to the fixed frame via a double-sided adhesive tape.

Thus, the first portion 61 and the second portion 62 remain partially fixed respectively with respect to the fixed frame 2 and to the movable frame 3.

The flexible ribbon 6 also comprises a third portion 64 extending in the fixed frame 2, in a plane orthogonal to the axis of rotation A.

This third portion 64 is connected to the first portion 61 by a 180° inner fold 65.

The third portion 64 is secured to the fixed frame 2. Henceforth, the first portion 61 could be free to move relative to the fixed frame 2, to allow a for greater angular movement between the movable frame 3 and the fixed frame 2, while remaining secured to the fixed frame 2 via the third portion 64.

In other words, the third portion 64 enables securing the first portion 61 to the fixed frame 2.

The flexible ribbon 6 also comprises a fourth portion 66 which extends in the movable frame 3, transversely to the second portion 62.

This fourth portion 66 is connected to the second portion 62 by a 90° back fold 67.

The fourth portion 66 enables the electrical connection of the flexible ribbon 6 with the printing head 31. For example, the fourth portion 66 may be partially soldered to the printing head 31.

Referring to FIG. 10, the flexible ribbon 6 comprises, when positioned flat between the third portion 64 and the fourth portion 66, a U-like shape having a base 600, a first wing 610 intended to form the first portion 61, and a second wing 620 intended to form the second portion 62.

The base 600 has:

- a 180° first fold line 601 of the flexible ribbon 6, at the junction between the first wing 610 and the second wing 620;
- a 180° second fold line 602 of the flexible ribbon 6, at the junction between the first wing 610 and the third portion 64, and
- a 90° third fold line 603 of the flexible ribbon 6, at the junction between the second wing 620 and the fourth portion 66.

Thus, the first fold line 601 is located between the second fold 602 and the third fold line 603.

The first fold line 601 is intended to materialize the folding area of the flexible ribbon 6 to form the 180° fold 63.

The second fold line 602 is intended to materialize the folding area of the flexible ribbon 6 to form the 180° inner fold 65.

The third fold line 603 is intended to materialize the folding area of the flexible ribbon 6 to form the 90° back fold 67.

Referring to FIG. 11, the first fold line 601 is also intended to form an axis of the radius of curvature of the fold 63, and the second fold line 602 is intended to form an axis of the radius of curvature of the 180° inner fold 65.

As visible in FIG. 11, in the closed position of the movable frame, i.e. when the ribbon 6 is formed, the first line 601, the second fold line 602 and the axis of rotation A are perpendicular in pairs in a three-dimensional space.

Referring to FIGS. 8 and 9, the flexible ribbon 6 comprises a fifth portion 68 extending the third portion 64 and forming an outer fold 69 substantially at a right angle with the third portion 64.

The fifth portion 68 enables junction of the flexible ribbon 6 with the electronic board 5.

To ensure holding of the movable frame 3 in the closed position with respect to the fixed frame 2, the thermal printing system 1 comprises a mechanism 7 for locking the movable frame 3 in the closed position.

This locking mechanism 7 comprises:

- a handling member 71 secured to the movable frame 3;
- at least one hook 72 secured to the handling member 71, and;
- at least one member 73 for holding the hook 72 secured to the fixed frame 2.

More specifically, referring to FIG. 5, the movable frame 3 carries two hooks 72 secured to the handling member 71.

Referring to FIG. 3, for each hook 72, the locking mechanism 7 comprises a holding member 73.

In this case, each holding member 73 is formed by a housing recessed in the lateral walls 231 of the framework 23.

In turn, the handling member 71 is rotatably mounted on the movable frame 3 by means of an axis 74 accommodated in circular apertures 323 of the shell 32 of the movable frame 3.

Furthermore, this locking mechanism also comprises at least one return element 75 interposed between the handling member 71 and the shell of the movable frame to push the handling member and therefore the hooks back into a position of holding or cooperation with the or each holding member.

The return element 75 is schematically shown in FIG. 4 as a compression spring positioned outside the shell 32. Nonetheless, the return element 75 may be positioned in the shell 32 so as not to be directly accessible.

Of course, the locking mechanism 7 could be reversed. In other words, the handling member 71 and the hooks 72 which are secured thereto would be mounted on the fixed frame 72, and the or each holding member 73 would be mounted on the movable frame 3.

The thermal printing system 1 also comprises a device 9 for detecting the position of the movable frame 3 with respect to the fixed frame 2 to ensure safeguarding of the thermal printing system 1 when the movable frame 3 is in its open position.

More specifically, safeguarding the printing system consists in preventing the operation of the printing head 31 when the latter does not face the running surface 31, i.e. the movable frame 3 is not in its closed position.

The detection device 9 is connected to the electronic control board 5 of the thermal printing system 1.

The detection device 9 comprises:

- a Hall-effect sensor 91 secured to one amongst the fixed frame 2 and the movable frame 3, and
- a permanent magnet 92 secured to the other one amongst the movable frame 3 and the fixed frame 2.

Preferably, the Hall-effect sensor 91 is secured to the fixed frame 2 and the permanent magnet 92 is secured to the movable frame 3.

The permanent magnet 92, schematically shown in FIG. 5, is located opposite the sensor 91 in the closed position.

In particular, the thermal printing system 1 is intended to enable printing of tickets (for example flight tickets or train tickets) or purchase receipt tickets.

Thus, since the paper to be printed entering the thermal printing system 1 is in the form of a paper strip packaged in the form of a roll, the thermal printing system 1 comprises a device 10 for cutting the printed paper strip.

This then allows cutting out the tickets to be retrieved by a user.

The cutting device 10 comprises a first cutting member 101 secured to the fixed frame 2 and a second cutting member 102 secured to the movable frame 3.

The first cutting member 101 and the second cutting member 102 are located opposite one another in the closed position of the movable frame 3.

Thus, when the paper is printed, at least one amongst the first cutting member 101 and the second cutting member 102 moves in the direction of the other one to cut the printed paper strip and thus cut out a ticket to be retrieved by the user in the outlet mouth 4.

The first cutting member 101 and the second cutting member 102 are movably mounted and actuated by a dedicated motor.

Each of the first cutting member 101 and the second cutting member 102 is in the form of a blade.

During pivoting of the movable frame 3 relative to the fixed frame 2, the 180° fold 63 moves over the first portion 61 or over the second portion 62 of the flexible ribbon 6.

More particularly, when the movable frame 3 moves from its closed position to its open position, the 180° fold 63 moves in the direction of the first portion 61, which has the effect of reducing the size of the first portion 61, and increasing the size of the second portion 62.

Conversely, when the movable frame 3 moves from its open position to its closed position, the 180° fold 63 moves in the direction of the second portion 62, which has the effect of reducing the size of the second portion 62, and increasing the size of the first portion 61.

Thus, the thermal printing system 1 according to the invention allows multiplying or adding the advantages of the existing solutions while reducing their drawbacks.

More specifically, thanks to pivoting of the movable frame 3 relative to the fixed frame 2 according to a parallel to the drive axis E, the free volume necessary for the mobility of the movable frame 3 is reduced in comparison with systems wherein the rotation of the movable frame 3 takes place orthogonally to the drive axis E.

In addition, the use of a flexible ribbon 6 allows preserving the electrical connection between the movable frame 3 and the electronic board 5 despite the pivoting of the movable frame 3, without any risk of deterioration of the flexible ribbon 6 thanks to the 180° fold 63.

Furthermore, the use of a double-sided type adhesive tape 8 to enable fastening of the second portion 62 of the flexible ribbon 6 to the movable frame 3, promotes an ordered folding of the flexible ribbon 6, which avoids degrading it for example by pinching between the movable frame 3 and the fixed frame 2.

An exemplary aspect of the present disclosure overcomes the drawbacks of the prior art.

More specifically, an exemplary aspect provides a thermal printing system enabling easy maintenance while limiting the bulk of the thermal printing system.

Another exemplary aspect provides such a thermal printing system, the manufacturing cost of which is low.

A further exemplary aspect provides such a thermal printing system which is safe to operate.

Although the present disclosure has been described with reference to one or more examples, workers skilled in the art will recognize that changes may be made in form and detail without departing from the scope of the disclosure and/or the appended claims.

The invention claimed is:

1. A thermal printing system comprising:

a fixed frame integrating a drive roll movable in rotation about a drive axis and configured to drive running of a strip of paper on a running surface of the drive roll;

a movable frame surmounting the fixed frame and carrying a printing head opposite the drive roll, the movable frame being pivotably mounted relative to the fixed frame about an axis of rotation parallel to the drive axis between a closed position on the running surface and an open position in which the movable frame is separated away from the running surface, an electrical connector for electrically connecting the printing head to a controller, wherein the electrical connector is in the form of a flexible electrical connection ribbon, wherein:

the flexible ribbon has, on the side of the fixed frame, in the closed position of the movable frame, first and second essentially planar portions extending in planes parallel to one another, the first portion for connection to a controller, and the second portion connected to the printing head, secured to the movable frame, the first portion and the second portion being connected by a 180° fold movable in a plane orthogonal to the axis of rotation between the open position and the closed position of the movable frame or vice versa.

2. The thermal printing system according to claim 1, wherein the flexible ribbon comprises a third portion and a fourth portion, which are arranged such that when the flexible ribbon adopts a flat position between the third portion and the fourth portion, the flexible ribbon has a U-like shape having a base, a first wing forming the first portion, and a second wing forming the second portion, the base having:

a 180° first fold line of the flexible ribbon at a junction between the first wing and the second wing;

a 180° second fold line of the flexible ribbon at a junction between the first wing and the third portion, and a 90° third fold line of the flexible ribbon located between the second wing and the fourth portion.

3. The thermal printing system according to claim 2, wherein the flexible ribbon comprises a fifth portion extending the third portion and forming a 90° outer fold with the third portion.

4. The thermal printing system according to claim 3, which comprises an electronic control board fixedly mounted with respect to the fixed frame.

5. The printing system according to claim 2, wherein:

the second fold line forms an axis of a radius of curvature of an inner fold between the first portion and the third portion, the first fold line forms an axis of a radius of curvature of the 180° , and wherein, in the closed position of the movable frame, the first line, the second fold line and the axis of rotation are perpendicular in pairs in a three-dimensional space.

6. The thermal printing system according to claim 1, which also comprises a detecting device for detecting a position of the movable frame with respect to the fixed frame, this detecting device being connected to a electronic control board of the thermal printing system to ensure safeguarding of the thermal printing system when the movable frame is in the open position.

7. The thermal printing system according to claim 6, wherein the detecting device comprises:

a Hall-effect sensor secured to one amongst the fixed frame and the movable frame, and a permanent magnet secured to the other one amongst the movable frame and the fixed frame, the sensor and the permanent magnet facing one another in the closed position of the movable frame.

8. The thermal printing system according to claim 1, which comprises a locking mechanism arranged to lock the movable frame in the closed position.

9. The thermal printing system according to claim 8, wherein the locking mechanism comprises:

a handling member secured to the movable frame;

at least one hook secured to the handling member, and at least one member for holding the hook secured to the fixed frame.

10. The thermal printing system according to claim 1, wherein the second portion of the flexible ribbon is fastened to the movable frame by a double-sided adhesive tape.

11. The thermal printing system according to claim 1, which comprises a cutting device for cutting a printed paper strip, the cutting device comprising a first cutting member secured to the fixed frame, and a second cutting member secured to the movable frame, opposite the first cutting member.

* * * * *